United States Patent [19]

Staring et al.

[11] Patent Number: 5,670,212
[45] Date of Patent: Sep. 23, 1997

[54] CVD METHOD OF PROVIDING A FILM OF CONJUGATED, SUBSTITUTED OR UNSUBSTITUTED POLY(P-PHENYLENE VINYLENE) ON A SUBSTRATE

[75] Inventors: Aemilianus G. J. Staring; Dirk J. Broer; Robert J. C. E. Demandt, all of Eindhoven, Netherlands

[73] Assignee: U.S. Philips Corporation, New York, N.Y.

[21] Appl. No.: 442,849

[22] Filed: May 17, 1995

[30] Foreign Application Priority Data

May 18, 1994 [EP] European Pat. Off. ............. 94201406

[51] Int. Cl.[6] .................................................. C23C 16/00
[52] U.S. Cl. .......................... 427/255.6; 427/69; 427/109; 427/314
[58] Field of Search ........................... 427/255.6, 69, 427/314, 109

[56] References Cited

U.S. PATENT DOCUMENTS 4,956,239  9/1990  Meijer et al. .

FOREIGN PATENT DOCUMENTS 9216023  1/1992  WIPO .

OTHER PUBLICATIONS

S. Iwatsuki et al, "New method for Preparation of Poly(phenylene–vinylene) Film", Chemistry Letters, 1991, pp. 1071–1074.

M. Hulbert et al, "Substituted Effect during the Synthesis of Substituted [2.2] Paracyclophane by Photoextrusion of Carbon Dioxide from a Cyclic Diester", J. Org. Chem, 1980, pp. 4496–4498.

Staning et al, Synth. Met., 67(1–3), 71–5, 1994 (Abstract).

Primary Examiner—Roy V. King
Attorney, Agent, or Firm—Norman N. Spain

[57] ABSTRACT

A conjugated poly(p-phenylene vinylene) is manufactured by means of CVD and using simple monomers. Such a polymer is particularly adaptable for use as an active layer in electroluminescent devices, such as a light-emitting diode.

20 Claims, 2 Drawing Sheets (I)

(II)

(III)

(IV)

(V)

(VI)

(VII)

(VIII)

(IX)          (X)          (XI)

CVD METHOD OF PROVIDING A FILM OF CONJUGATED, SUBSTITUTED OR UNSUBSTITUTED POLY(P-PHENYLENE VINYLENE) ON A SUBSTRATE

BACKGROUND OF THE INVENTION

The invention relates to a method of providing a film of a conjugated, substituted or unsubstituted poly(p-phenylene vinylene) on a subtrate by chemical vapour deposition (CVD). The invention also relates to a method of manufacturing an electroluminescent (EL) device, in particular a light-emitting diode (LED), in which use is made of such a conjugated polymer.

Solid-state LEDs have found widespread application, for example, in displays and indicator lamps. For the active or emissive layer in EL structures, use is generally made of traditional III–V semiconductor compounds, such as doped GaAs and GaP. The action is based on recombinations of electron-hole pairs which are injected into the semiconductor material from electrodes situated on either side of the active layer. By virtue of these recombinations, energy is released in the form of (visible) light; this phenomenon is commonly referred to as electroluminescence. The wavelength and hence the colour of the emitted light is determined by the band gap of the semiconductor material.

Using the known technologies in combination with the above-mentioned inorganic semiconductor materials, it is very difficult to manufacture large-area displays having dimensions of, for example, several centimeters. In addition, the available colours of the emitted light are limited to the long wavelength end of the visible spectrum.

The use of semiconductive organic polymers expands the number of materials which can be used in EL devices. Semiconductive, organic polymers have a conjugated polymeric chain. The band gap, the electron affinity and the ionization potential can be adjusted by choosing the proper conjugated polymeric chains and suitable side chains. In addition, such polymers enable flexible substrates to be used.

Conjugated polymers which can suitably be used as the active layer in EL devices are of poly(p-phenylene vinylene) (PPV) and deriving of PPV each at poly(2-methoxy, 5-(2'-ethylhexyloxy)-p-phenylene vinylene) (MEH-PPV). These undoped conjugated polymers are semiconductors and they are flexible and resistant to, inter alia, oxygen. Most of the known methods for the manufacture of a film of said derivatives employ organic solvents. Some of said derivatives can be dissolved as a conjugated polymer in a solvent, whereafter a polymeric layer is spin coated on to a substrate. Other derivatives can be formed by using a soluble non-conjugated polymeric precursor which is converted to a conjugated polymer in a thermal post-treatment after the solution of the precursor has been spin coated. These methods are described in the International Patent Application WO 92/16023.

A disadvantage of spin coating is that the films formed are generally insufficiently uniform to be used in EL devices, in particular if substrates are used which are not flat. In addition, the known methods are less suited for the manufacture of a polymeric layer having a predetermined thickness and uniformity.

In an article by S. Iwatsku et. al., Chemistry Letters, pp. 1071–1074 (1991), a description is given of a method for the manufacture of PPV by means of chemical vapour deposition (CVD), using the monomer 1,9-dichloro[2.2] paracyclophane, which is a compound having two aromatic rings. In theory, CVD processes are attractive because of the uniformity of the deposited layers and because accurate layer thicknesses can be attained and monitored during the process. In addition, CVD processes are customary in the semiconductor industry. A disadvantage of this known method is that the rather complicated monomer is not commercially available, but must be prepared via a time-consuming synthesis. The presence of two aromatic rings in the monomer causes the vapour pressure to be relatively low, so that this monomer is less suited for use in a CVD process.

SUMMARY OF THE INVENTION

It is an object of the invention to provide, inter alia, a method of manufacturing a film of a conjugated polymer of substituted or unsubstituted PPV by means of a CVD process, which polymeric film can suitably be used as an active layer in EL devices and the monomer used can be prepared in a simple manner or is commercially available. Another object of this invention is to provide such a method that is continuous, without the necessity of purifying or reprocessing of the polymeric intermediate products formed, which are generally instable.

An additional object of this invention is to provide a method of manufacturing a LED whose active layer is formed by a conjugated polymer of substituted or unsubstituted PPV.

These objects are achieved by a method as described in the opening paragraph, which is characterized in accordance with the invention in that the polymer has the following formula

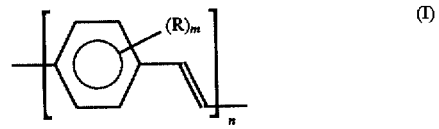

wherein R is selected from the group formed by H, a $C_1$–$C_5$ alkyl group or alkoxy group and CN, wherein m=1 to 4 and n=10 to 100,000, and the method for manufacturing the polymer comprises the following successive steps:

a. evaporation of at least one monomeric compound of the formula

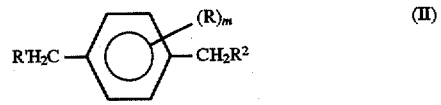

wherein $R^1$ and $R^2$ represent a halogen atom and R and m have the above-mentioned meaning, in a first thermal zone at a temperature of from approximately 50° C. to approximately 250° C., b. transporting the evaporated monomeric compound through a second thermal zone at a temperature of from approximately 500° C. to approximately 900° C., thereby forming a conjugated precursor, c. transporting the precursor of step b. to a third thermal zone in which a substrate is provided at a temperature below 500° C., thereby forming a film of the polymer of formula (I) on the substrate.

The monomers represented by formula (II) should be sufficiently volatile to be used in a CVD process. Since it must be possible to evaporate the monomers prior to decomposition, the choice of suitable substituents R is limited. If the substituents R become too large, the vapour pressure of the monomer will generally decrease. If R=H, then the aromatic ring is unsubstituted.

Suitable alkyl groups designated by R are methyl, ethyl, propyl, butyl and pentyl groups designated by either branched or unbranched. Suitable alkoxy groups R are methoxy, ethoxy, propoxy, butoxy and pentoxy groups, either branched or unbranched. Due to the lower vapour pressure, methyl and methoxy groups are preferred.

For $R^1$ and $R^2$ use is preferably made of a bromine atom on account of the reactivity in the thermal elimination process.

In the method in accordance with the invention, use can suitably be made of, inter alia, the following monomers (II):

α,α'dichloro-p-xylene (see formula III of FIG. 2)

α,α'-dibromo-p-xylene (see formula IV of FIG. 2)

α,α'-dibromo-2-cyano-p-xylene (see formula V of FIG. 2)

α,α'-dibromo-2-methoxy-p-xylene (see formula VI of FIG. 2)

α,α'-dibromo-2-methoxy-5-cyano-p-xylene (see formula VII of FIG. 2).

These monomers are commercially available or can be prepared by a simple modification. A very suitable monomer is α,α'-dibromo-2-cyano-p-xylene (see formula V of FIG. 2), which can be prepared by refluxing a mixture of 2,5-dimethylbenzonitryl, N-bromosuccinimide and benzoyl peroxide in carbon tetrachloride for several hours. The solid formed is recrystallized from a mixture of petroleum ether and toluene and subsequently dried under a vacuum. Another suitable monomer is α,α'-dibromo-2-methoxy-p-xylene (see formula VI of FIG. 2), which can be prepared by refluxing a mixture of 2,5-dimethylanisol, N-bromosuccinimide and benzoyl peroxide in carbon tetrachloride in a nitrogen atmosphere for several hours. The solid formed is recrystallized from hexane and subsequently dried under a vacuum.

The monomers evaporate in the first thermal zone at a temperature in the range between approximately 50° C. and approximately 250° C., in particular between approximately 80° C. and approximately 150° C. To preclude hot spots, the temperature of the monomer is preferably slowly increased to the desired value.

The temperature of the second thermal zone is determined by the temperature at which the evaporated monomer is pyrolised into a conjugated precursor (see for example formula VIII of FIG. 2, where $R^1=H, R^2=Br$ and $R=H$) in the vapour phase. This temperature can be determined in a simple manner by measuring the thickness of the film in the third thermal zone. The temperature of the second thermal zone is too low if film-formation does not take place. If a considerable quantity of carbon is formed on the substrate or the wall of the furnace, then the temperature of the second thermal zone is too high.

To transport the monomer (II) through the thermal zones, use is generally made of an inert carrier gas, such as argon. Advantageously, a tubular furnace having different temperature zones is used, which furnace can also be used under a vacuum.

In the method in accordance with the invention, HCl or HBr is eliminated to convert the monomers (II) via a conjugated precursor (see for example formula VIII of FIG. 2, where $R^1=H, R^2=Br$ and $R=H$) to a conjugated polymer (I), while retaining the same substituents R on the aromatic ring. In the elimination process, 2 moles of HCl or HBr are split off per mole of monomer.

The aromatic rings of the polymer (I) can each be substituted with one to four substituents R. Per aromatic ring, the substituents may be different or the same. The rings may comprise the same or different substituent(s). If the rings comprise different substituents, the polymer is a copolymer or terpolymer. A conjugated copolymer or terpolymer can be prepared by using, respectively, two or three different monomers (II). If different monomers are used, it is desirable that they all have approximately the same vapour pressure in order to obtain an optimum control of the ultimate polymeric composition. If the vapour pressures differ widely, the monomers can be evaporated in separate zones at adapted temperatures and finally be separately transported to the third thermal (substrate) zone.

The degree of polymerization n of the conjugated polymer (I) ranges between 10 and 100,000.

Dependent upon the substituents R used, it is possible to manufacture LEDs which emit light in the desired colours red, green, blue or intermediate colours.

The film of the conjugated polymer (I) formed generally has a layer thickness in the range between 50 and 250 nm, in particular between 100 and 200 nm. The growth rate of the polymeric film depends on the velocity of the carrier gas and the temperature in the first thermal zone and ranges between 100 nm and 10 μm/hour.

For example, glass, quartz glass, ceramic material or synthetic resin can be used as the substrate. In the manufacture of a polymeric LED, the substrate is formed by a layer of an electrode material (which will be specified hereinbelow) on, for example, a transparent, flexible foil of synthetic resin which is resistant to the prevailing temperature in the third thermal zone. If a synthetic resin substrate is used, preferably, polyimide or polytetrafluoroethylene is employed because of the temperature resistance. The substrate is preferably provided on a substrate holder which enables the substrate to be heated or cooled to the desired temperature. In that case, the third thermal zone is formed by the substrate itself.

If the temperature of the third thermal zone is below approximately 100° C., a non-conjugated precursor polymer is formed which can be converted to a conjugated polymer by heating to a temperature above 100° C. if the temperature of the third thermal zone is higher than approximately 100° C., a conjugated polymeric (I) film is directly formed. The walls of the third thermal zone themselves may constitute the substrate on which the polymeric film is formed, or a special substrate of a specific shape can be placed inside the third thermal zone.

The object of providing a method of manufacturing an LED is achieved in accordance with the invention by a method which is characterized by the following steps:

a. providing a first, transparent electroconductive layer on a substrate, b. providing the first layer with an active layer comprising at least one layer of a conjugated poly(p-phenylene vinylene) in accordance with formula (I) by means of a CVD process, by using a monomer in accordance with formula (II), as described above, c. providing a second electroconductive layer on the active layer.

The substrate for use can be made of the above-mentioned inorganic substrate, but preferably is made of transparent, flexible polymeric substrates, such as polyimide, polytetrafluoroethylene or polyethylene terephtalate. For certain synthetic resin substrate materials it is necessary to maintain the temperature below 200° C. If necessary, the substrate is cooled in the third thermal zone to below said temperature.

In some cases, it is advantageous to rub the polymeric substrate in one direction with a velvet cloth or to stretch it in one direction before the various layers are provided. If the conjugated polymer is deposited on such a substrate, said polymer exhibits a uniaxial orientation which is parallel to the direction of rubbing. As a result, the light emitted by an LED having such an oriented, active layer is polarized, the plane of polarization extending parallel to the direction of rubbing.

The substrate is provided with a first, transparent electroconductive layer which serves as the electrode for the injection of holes into the active layer of conjugated PPV to be provided on said electroconductive layer. The material of this first layer has a high work function and is constituted by, for example, a thin layer of gold or silver or, preferably, by a layer of indium oxide or indium-tin oxide (ITO). This first layer must be transparent to the light emitting from the active layer. In particular ITO is very suitable due to its good electrical conductivity and high transparency. This first layer can be provided on the substrate by means of methods which are known per se, such as vapour deposition, sputtering or chemical vapour deposition.

Subsequently, the active layer of conjugated PPV is provided on said first electroconductive layer by means of the above-described CVD process. The active layer may consist of a single layer, but may alternatively comprise more, for example three, layers of different types of conjugated PPV. The layer adjoining the first electroconductive layer is then optimized for the injection of holes and comprises conjugated PPV which is substituted with electron-donating groups, such as alkoxy groups. The layer adjoining the second electroconductive layer is optimized for the injection of electrons and comprises conjugated PPV which is substituted with electron-accepting groups, such as CN groups. A layer of, for example, unsubstituted PPV is situated between the two boundary layers. The active layer may alternatively be built up of a multilayer of two types of conjugated PPV (for example in accordance with formulas IX and X) which are alternately provided. Each of said types of layers has a thickness of from 1 to 10 nm. In this manner, a so-called quantum well structure is formed by means of which different emission wavelengths are obtained. These multilayer structures of different types of PPV can be obtained in a simple manner by means of the method in accordance with the invention, by using different types of monomers which are successively or alternately passed through the second and third thermal zone of the furnace. The number of first thermal zones used in the method then corresponds to the number of different types of monomers. In that case, the first thermal zones are connected to the second thermal zones by means of valves.

The active layer is provided with a second electroconductive layer which serves as the electrode for the injection of electrons into the active layer. The material of this second electro conductive layer has a low work function and consists of a layer of, for example, indium, calcium, barium or magnesium. This second layer can also be provided by means of the above-mentioned methods. In particular when reactive barium is used, it is efficacious to cover said second electroconductive layer with a protective layer of, for example, epoxy or an inert metal.

It is noted that in U.S. Pat. No. 4,956,239, filed by Applicants, a description is given of a method of preparing poly-1,2-azepine by means of photochemical polymerization of phenylazide in the gas phase. The polymer formed is conjugated and becomes electroconductive after it has been doped with iodine. However, the polymer obtained does not exhibit electroluminescent properties.

BRIEF DESCRIPTION OF THE DRAWINGS

The invention will be explained in greater detail by means of exemplary embodiments and with reference to the accompanying drawings, in the drawings, FIG. 1 diagrammatically shows a device for the application of the method in accordance with the invention, FIGS. 2(I), 2(II), 2(III), 2(IV), 2(V), 2(VI), 2(VII), 2(VIII), 2(IX), 2(X) and 2(XI) show the formulas of the conjugated polymer PPV (I, IX, X and XI), of monomers (II) to (VII) which can suitably be used in the method in accordance with the invention, and of a conjugated precursor (VIII) formed by the method in accordance with the invention.

DESCRIPTION OF THE PREFERRED EMBODIMENTS

The invention will be explained in greater detail by means of exemplary embodiments and with reference to the accompanying drawings.

Exemplary Embodiment 1

Figure 1:
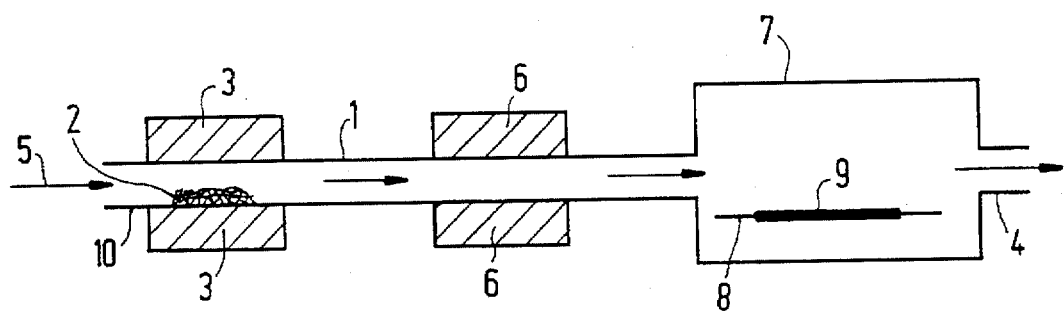

FIG. 1 diagrammatically shows a device for carrying out the method in accordance with the invention. In said Figure, a tubular furnace 1 of quartz glass is shown, in which a solid or liquid monomeric compound 2 is placed in a first thermal zone which is heated by heating elements 3. Dependent upon the monomer used, the temperature ranges between approximately 50° C. and 250° C. A vacuum pump (not shown) which is connected to an aperture 4 is used to maintain a partial vacuum of less than 10 Pa in the furnace. An aperture 10 is provided with a needle valve (not shown) having a capillary tube. Arrow 5 indicates a stream of an argon carrier gas which transports the monomer 2 in the vapour state to a second thermal zone heated by heating elements 6, thereby forming a conjugated precursor (formula VIII in FIG. 2). The temperature in the second thermal zone ranges between approximately 500° C. and 900° C. The carrier gas and the conjugated precursor are led to a third thermal zone 7 where the temperature is below 500° C. and in which zone there is a substrate 8. A polymeric film 9 is formed on the substrate 8. The layer 9 obtained has a very uniform layer thickness. If the temperature in zone 7 is below approximately 100° C., a non-conjugated precursor polymer is formed. If the temperature is above 100° C., conjugated PPV in accordance with formula (I) is formed. During deposition of the polymeric film 9, the thickness can be monitored by means of a quartz crystal oscillator which is arranged in the vicinity of the substrate 8.

Exemplary Embodiment 2

In the arrangement as described in exemplary embodiment 1, 0.79 g of α,α'-dibromo-p-xylene (formula IV in FIG. 2; supplier Aldrich) is placed in the position indicated by reference numeral 2 (FIG. 1). The heating elements 3 are slowly heated to 150° C. The second thermal zone is heated to 710° C. by heating elements 6, while the third thermal zone 7 is heated to 200° C. Flat, glass substrates are placed in the position indicated by reference numeral 8. The entire arrangement is evacuated to a pressure of $10^{-3}$ Pa, whereafter a nitrogen stream is adjusted by means of the needle valve at reference numeral 10 to obtain a pressure of 0.1 Pa. A transparent film 9 of conjugated PPV (formula IX of FIG.

2) having a layer thickness of 200 nm is deposited on the glass substrates 8. The film exhibits electroluminescence in the green spectral range, with maximum emission around 550 nm.

Exemplary Embodiment 3

Exemplary embodiment 2 is repeated, with this difference that the third thermal zone 7 is not heated and the substrate is maintained at room temperature. A film of a non-conjugated precursor polymer comprising one bromine atom per monomeric unit is deposited on the substrate. After heating the substrate to 220° C. for 1.5 hours at a pressure of 0.1 Pa, a film of conjugated PPV (formula IX of FIG. 2) is formed which is identical to the film obtained according to exemplary embodiment 2.

Exemplary Embodiment 4

Exemplary embodiment 1 is repeated, with this difference that $\alpha,\alpha'$-dibromo-2-cyano-p-xylene (see formula V of FIG. 2) is used as the monomer. Using 2,5-dimethyl benzonitril (supplier Aldrich) as the starting material, this monomer is prepared in accordance with a method which is analogous to the one described by M. Hilbert el. al. in J. Org. Chem., 45, 4496–4498 (1980). The monomer starts to evaporate at approximately 80° C. The temperature in the second thermal zone is 640° C. A transparent film 9 of conjugated PPV (formula X of FIG. 2) substituted with a CN group is deposited on the glass substrates 8 in a layer thickness of 200 nm. The film exhibits electroluminescence in the green spectral range, with maximum emission around 540 nm.

Exemplary Embodiment 5

Figure 2:
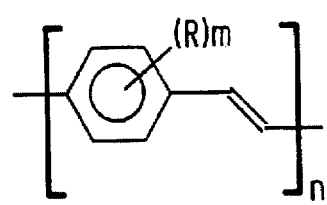
Figure 2:
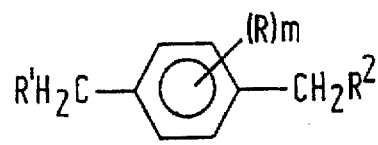
Figure 2:
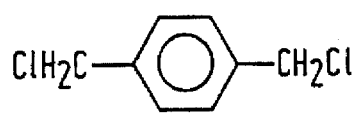
Figure 2:
Figure 2:
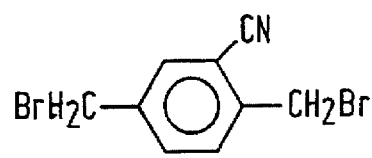
Figure 2:
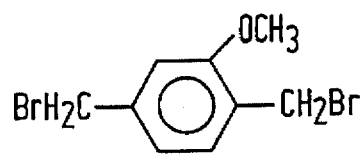
Figure 2:
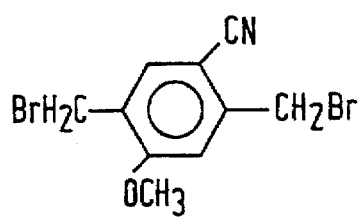
Figure 2:
Figure 2:
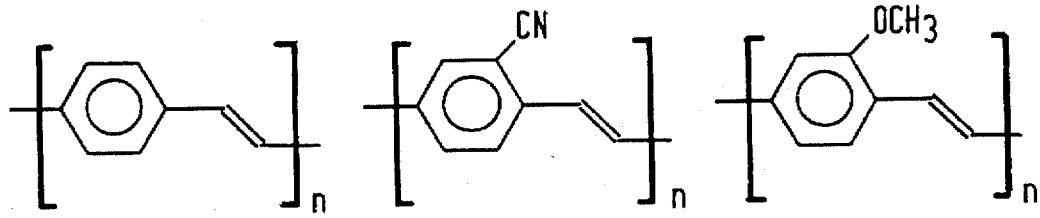

Exemplary embodiment 1 is repeated, with this difference that the monomer used is $\alpha,\alpha'$-dibromo-2-methoxy-p-xylene (see formula VI of FIG. 2). This monomer is prepared according to the method described by M. Hilbert et. al. in J. Org. Chem., 45, 4496–4498 (1980), starting from 2,5-dimethylanisol (supplier Aldrich). A transparent film 9 of conjugated PPV (formula XI of FIG. 2) substituted with a methoxy group is deposited on the glass substrates 8 in a layer thickness of 200 nm. The film exhibits electroluminescence in the yellow spectral range, with maximum emission around 610 nm.

Exemplary Embodiment 6

Figure 3:
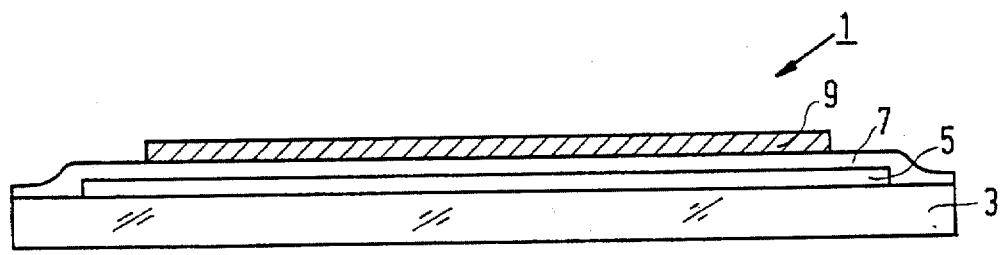
FIG. 3 is a diagrammatic cross-sectional view of an EL device, in particular a LED, comprising an active layer of PPV obtained by means of the method in accordance with the invention.

In FIG. 3, reference numeral 1 refers to a diagrammatically represented cross-sectional view of a polymeric LED structure. A transparent indium-tin oxide layer (ITO) 5 having a surface resistance below 20 Ω/square is sputtered on to a glass substrate 3. Said layer 5 serves as the electrode layer for injecting holes in the active layer 7 of conjugated PPV (formula IX of FIG. 2) which is to be subsequently deposited. This active layer 7 has a thickness of 150 nm and is manufactured in accordance with the method described in exemplary embodiment 2. A calcium layer 9 is vapour deposited on to this active layer 7 at a pressure below $2.10^{-4}$ Pa. The calcium layer 9 has a layer thickness of 250 nm and serves as the electrode for injecting electrons into the active layer 7. The size of the polymeric LED is 1 cm².

Both electrode layers 5 and 9 are connected to a DC source. The polymeric film 7 of conjugated PPV emits homogeneous green light which is clearly visible under daylight circumstances. The efficiency attained is 0.1%, i.e. one photon is generated per 1,000 electrons injected into the active layer.

Figure 4:
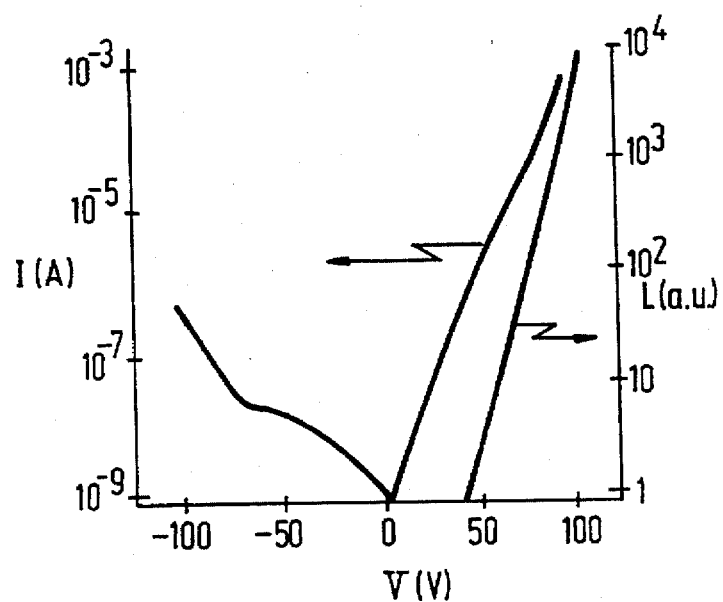
FIG. 4 shows an I-V and L-V characteristic of an LED manufactured by means of the method in accordance with the invention.

FIG. 4 shows the characteristic of the LED obtained, the current I, in Ampère, being plotted as a function of the applied voltage V, in volts, between the electrodes. In addition, the quantity of light L is shown, in arbitrary units (a.u.) as a function of the voltage V.

The method in accordance with the invention enables polymeric LEDs having a large surface area to be manufactured in a simple manner by means of a CVD process, the active layer of said LEDs being constituted by a conjugated PPV based on readily available monomers. The layer thickness of the active layer is uniform, so that the method is particularly suitable for large and/or non-planar substrates.

We claim:

1. A method of depositing a film of conjugated, substituted or unsubstituted poly(p-phenylene vinylene) on a substrate by chemical vapour deposition (CVD), characterized in that the polymer has the following formula

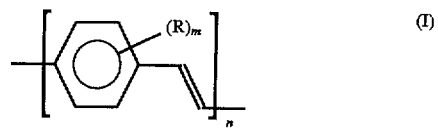

wherein R is selected from the group formed by H, a $C_1$–$C_5$ alkyl group or alkoxy group and CN, wherein m=1 to 4 and n=10 to 100,000, said method comprising the following successive steps:

a. evaporating at least one monomeric compound of the formula

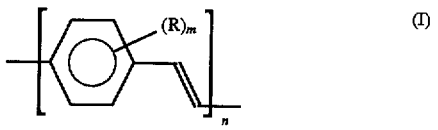

wherein $R^1$ and $R^2$ represent a halogen atom and R and m have the above-mentioned meaning, in a first thermal zone at a temperature of from approximately 50° C. to approximately 250° C., b. transporting the evaporated monomeric compound through a second thermal zone at a temperature of from approximately 500° C. to approximately 900° C., thereby forming a conjugated precursor, c. transporting the precursor of step b. to a third thermal zone in which the substrate is placed at a temperature below 500° C., thereby forming the film of the polymer of formula (I) on the substrate.

2. A method as claimed in claim 1, characterized in that for the monomeric compound use is made of $\alpha,\alpha'$-dichloro-p-xylene.

3. A method as claimed in claim 1, characterized in that $\alpha,\alpha'$-dibromo-p-xylene is used as the monomeric compound.

4. A method as claimed in claim 1, characterized in that $\alpha,\alpha'$-dibromo-2-cyano-p-xylene is used as the monomeric compound.

5. A method as claimed in claim 1, characterized in that $\alpha,\alpha'$-dibromo-2-methoxy-p-xylene is used as the monomeric compound.

6. A method as claimed in claim 1, characterized in that $\alpha,\alpha'$-dibromo-2-methoxy-5-cyano-p-xylene is used as the monomeric compound.

7. A method as claimed in claim 1, characterized in that the temperature of the substrate is in excess of 100° C.

8. A method of manufacturing a light-emitting diode, said method comprising:

a) depositing a first, transparent, electroconductive layer on a substrate,
b) providing said first layer with an active layer comprising at least one layer of a conjugated poly (p-phenylene vinylene) polymer of the formula

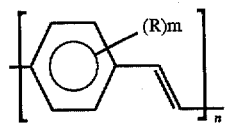

wherein R is a member selected from the group consisting of H, C—C alkyl, C—C alkoxy and CN, wherein m=1 to 4 and n=10 to 100,000 by the following successive steps:
1) vaporizing at least one monomeric compound of the formula

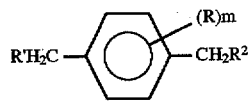

wherein R' and R² each represent a halogen and R and m have the above-mentioned meaning, in a first thermal zone at a temperature of from approximately 50° C. to approximately 250° C.,
2) transporting the vaporized monomeric compound through a second thermal zone at a temperature of from approximately 500° C. to approximately 900° C. to thereby form a conjugated precursor,
3) placing said substrate, provided with said first layer, in a third thermal zone in which said substrate is at a temperature of below 500° C. and transporting said precursor to said third thermal zone to thereby form said active layer comprising at least one layer of polymer on said first layer,
c) and providing a second electroconductive layer on said active layer.

9. A method of claim 8 wherein the monomeric compound is α,α'-dichloro-p-xylene.

10. A method of claim 8 wherein the monomeric compound is α,α'-dibromo-p-xylene.

11. A method of claim 8 wherein the monomeric compound is α,α'-dibromo-2-cyano-p-xylene.

12. A method of claim 8 wherein the monomeric compound is α,α'-dibromo-2-methoxy-p-xylene.

13. A method of claim 8 wherein the monomeric compound is α,α'-didromo-2-methoxy-5-cyano-p-xylene.

14. A method of claim 8 wherein the temperature of the substrate is in excess of 100° C.

15. A method as claimed in claim 8, characterized in that the substrate is made of a transparent, flexible synthetic resin substrate.

16. A method as claimed in claim 8, characterized in that indium-tin oxide is used as the first, electroconductive layer.

17. A method as claimed in claim 8, characterized in that a synthetic resin substrate is used which is rubbed or stretched in one direction before the active layer is provided.

18. A method as claimed in claim 8, characterized in that the active layer is built up of at least three layers of substituted or unsubstituted poly(p-phenylene vinylene).

19. A method as claimed in claim 9, characterized in that the substrate is made of a transparent, flexible synthetic resin substrate.

20. A method as claimed in claim 10, characterized in that the substrate is made of a transparent, flexible synthetic resin substrate.

* * * * *